(12) United States Patent
Bazer-Bachi et al.

(10) Patent No.: US 9,082,924 B2
(45) Date of Patent: Jul. 14, 2015

(54) METHOD FOR PREPARING AN N+PP+ OR P+NN+ STRUCTURE ON SILICON WAFERS

(75) Inventors: Barbara Bazer-Bachi, Villate (FR); Mustapha Lemiti, Lyons (FR); Nam Le Quang, Saint Alban de Roche (FR); Yvon Pellegrin, Frontignan (FR)

(73) Assignees: EDF ENR PWT (FR); SYNERGIES POUR EQUIPEMENTS MICRO-ELECTRONIQUE COMMUNICATION OPTIQUE SA (FR); INSTITUT NATIONAL DES SCIENCES APPLIQUEES DE LYON (FR); CENTRE NATIONAL DE LA RECHERCHE SCIENTIFIQUE (FR)

( * ) Notice: Subject to any disclaimer, the term of this patent is extended or adjusted under 35 U.S.C. 154(b) by 238 days.

(21) Appl. No.: 13/643,641

(22) PCT Filed: Apr. 26, 2011

(86) PCT No.: PCT/FR2011/050948
§ 371 (c)(1),
(2), (4) Date: Jan. 21, 2013

(87) PCT Pub. No.: WO2011/135249
PCT Pub. Date: Nov. 3, 2011

(65) Prior Publication Data
US 2013/0112260 A1    May 9, 2013

(30) Foreign Application Priority Data
Apr. 26, 2010 (FR) ..................... 10 53154

(51) Int. Cl.
*H01L 21/00* (2006.01)
*H01L 21/22* (2006.01)
(Continued)

(52) U.S. Cl.
CPC .............. *H01L 31/18* (2013.01); *H01L 21/225* (2013.01); *H01L 21/2255* (2013.01);
(Continued)

(58) Field of Classification Search
USPC .............. 438/72, 98, 542, 563; 257/E21.141, 257/E21.142, E21.143, E21.135
See application file for complete search history.

(56) References Cited

U.S. PATENT DOCUMENTS

| 4,152,824 A | 5/1979 | Gonsiorawski |
| 5,258,077 A * | 11/1993 | Shahryar ..................... 136/256 |
| 2011/0297223 A1 * | 12/2011 | Krause et al. ................. 136/256 |

FOREIGN PATENT DOCUMENTS

| GB | 2077996 A | 12/1981 |
| JP | 53-063993 A | 6/1978 |

(Continued)

OTHER PUBLICATIONS

Asahi et al., English Machine Translated of JP Publication No. 2000-277-503, Jun. 10, 2000; (Machine Translation Nov. 7, 2014).*

(Continued)

*Primary Examiner* — Mohsen Ahmadi
(74) *Attorney, Agent, or Firm* — Cantor Colburn LLP

(57) ABSTRACT

The present invention relates to a method for preparing, on a silicon wafer, an n+pp+ or p+nn+ structure which includes the following consecutive steps: a) on a p or n silicon wafer (1), which includes a front surface (8) and a rear surface (9), a layer of boron-doped silicon oxide (BSG) (2) is formed on the rear surface (9) by PECVD, followed by a $SiO_x$ diffusion barrier (3); b) a source of phosphorus is diffused such that the phosphorus and the boron co-diffuse and in order also to form: on the front surface (8) of the wafer obtained at the end of step a), a layer of phosphorus-doped silicon oxide (PSG) (4) and an n+ doped area (5); and on the rear surface of the wafer obtained at the end of step a), a boron-rich area (BRL) (6), as well as a p+ doped area (7); c) the layers of BSG (2) and PSG (4) oxides and $SiO_x$ (3) are removed, the BRL (6) is oxidized and the layer resulting from said oxidation is removed. The invention also relates to a silicon wafer having an n+pp+ or p+nn+ structure, which can be obtained by said preparation method, as well as to a photovoltaic panel manufactured from such a silicon wafer.

8 Claims, 2 Drawing Sheets

(51) Int. Cl.
| | |
|---|---|
| *H01L 21/38* | (2006.01) |
| *H01L 31/18* | (2006.01) |
| *H01L 21/225* | (2006.01) |
| *H01L 31/0224* | (2006.01) |
| *H01L 31/068* | (2012.01) |
| *H01L 29/12* | (2006.01) |
| *H01L 31/0232* | (2014.01) |

(52) U.S. Cl.
CPC ......... *H01L 29/12* (2013.01); *H01L 31/02327* (2013.01); *H01L 31/022425* (2013.01); *H01L 31/068* (2013.01); *H01L 31/1804* (2013.01); *Y02E 10/547* (2013.01)

(56) References Cited

FOREIGN PATENT DOCUMENTS

| JP | 2000-277503 A | 10/2000 |
|---|---|---|
| WO | 02093621 A1 | 11/2002 |

OTHER PUBLICATIONS

A. Das et al. "20% Efficient Screen Printed Boron BSF Cells Using Spin-on Dielectric Passivation", Photovoltaic Specialists Conference (PVSC), 34th IEEE, Jun. 7, 2009, pp. 477-481, Piscataway, NJ, USA, XP031626839.

International Search Report and Written Opinion issued Jul. 7, 2011 re: PCT/FR2011/050948 citing: GB 2 077 996 A, US 4,152,824 A, JP 53 063993 A, Kranzl et al., Das et al., Moussi et al., Krygowski et al., Kessler et al., JP 2000-277503 A, WO 02/093621 A1.

Michael Andreas Kessler et al., "Characterisation and Implications of the Boron Rich Layer Resulting From Open-Tube Liquid Source BBR3 Boron Diffusion Processes", Photovoltaic Specialists Conference (PVSC), 34th IEEE, Jun. 7, 2009, pp. 1556-1561, Piscataway, NJ, XP031626646.

D. S. Kim et al. "Silicon Solar Cells With Boron Back Surface Field Formed by Using Boric Acid", 22nd European Photovoltaic Solar Energy Conference, Sep. 3-7, 2007, 4 pgs., Milan Italy.

A. Kranzl et al. "Bifacial Solar Cells on Multi-Crystalline Silicon With Boron BSF and Open Rear Contact", Photovoltaic Energy Conversion, Conference Record of the 2006 IEEE 4th Wold Conference, May 1, 2006, pp. 968-971, PI, XP031007467.

Krygowski et al. "A Simultaneously Diffused, Textured, in Situ Oxide AR-Coated Solar Cell Process (STAR Process) for High-Efficiency Silicon Solar Cells", IEEE Transaction on Electron Devices, Jan. 1998, pp. 194-199, vol. 45, No. 1, Piscataway, NJ, XP011016393.

J. Libal et al. "Record Efficiencies of Solar Cells Based on N-Type Multicrystalline Silicon", 22nd European Photovoltaic Solar Energy Conference, Sep. 3-7, 2007, 5 pgs., Milan Italy.

A. Moussi et al. "Bifacial Silicon Solar Cells Fabrication by Simultaneous Diffusion of Boron and Phosporous", Proceedings of the International Photovoltaic Energy Conference, May 9-13, 1988, pp. 1378-1381, vol. 2, NL, XP000044528.

S. Riegel et al. "Comparison of the Passivation Quality of Boron and Aluminum BSF for Wafers of Varying Thickness", 24th European Photovoltaic Solar Energy Conference, Sep. 21-25, 2009, 4 pgs., Hamburg Germany.

* cited by examiner

METHOD FOR PREPARING AN N+PP+ OR P+NN+ STRUCTURE ON SILICON WAFERS

TECHNICAL FIELD

The present invention pertains to the photovoltaic technical field. More specifically, it concerns a novel method for preparing photovoltaic cells on silicon wafers.

BRIEF DESCRIPTION OF RELATED ART

In the photovoltaic industry, the manufacturing costs of silicon wafers account for a major part of the production costs of solar cells i.e. photovoltaic cells. To reduce these manufacturing costs, it is known either to use materials of lesser quality, which is not a satisfactory solution, or to seek to reduce the thickness of these silicon wafers.

With a view to obtaining top-performing photovoltaic cells, this tendency towards ever thinner silicon wafer thickness must nevertheless be weighed against the search for the following characteristics:

quality back surface contacts;
low back surface recombination velocity (BSRV). It is to be noted that the interface between the silicon and a conductive contact is a region with high recombination;
high back surface reflectance (BSR).

The most frequently used technique for forming back surface contacts of quality is the creation of a back surface field of aluminum (Al-BSF) via serigraphy. However, this yields a high BSRV (more than 400 cm/s) and a low BSR (60-70%). In addition, on account of the different coefficients of expansion of the two materials (Si and Al), this technique may cause bending of the silicon wafers which is all the more extensive the thinner the said wafers (namely a thickness of less than 180 μm).

On this account it has been envisaged, as alternative to these Al-BSFs, to use boron back surface fields (B-BSF). This alternative is one of the more promising solutions for obtaining quality back surface contacts. With B-BSF fields the following advantages are obtained compared with an Al-BSF:

A B-BSF can be formed without inducing stresses in the silicon substrate and therefore does not create any bending of the silicon wafer.

A B-BSF produces a more highly concentrated $p^+$ region due to its greater limit solubility in silicon, which therefore allows a lower recombination rate (stronger back surface repelling field).

A B-BSF can be produced in combination with dielectric passivation thereby reducing back surface recombination (BSRV) and increasing reflectance (BSR).

However, the diffusing of boron is considered to be one of the most difficult techniques to perform in solar cell manufacturing processes. The coefficient of diffusion of boron is much lower than that of phosphorus. As a result, high diffusion temperatures must be applied for the diffusion of boron. This is why, when $BBr_3$ is used as boron source, its diffusion must be carried out before the diffusion of the emitter, to prevent the redistribution of phosphorus atoms.

Some prior art documents describe processes for the diffusion of boron and phosphorus for the formation of B-BSFs and thereby to obtain silicon wafers having a structure of $n^+pp^+$ type or $p^+nn^+$ type.

In this respect, the publication <<Comparison of the passivation quality of boron and aluminum BSF for wafers of varying thickness>> by S. RIEGEL et al., 24$^{th}$ European Photovoltaic Solar Energy Conference, Hamburg, Germany, 21-25 Sep. 2009, describes a process for manufacturing silicon wafers using the diffusion of $BBr_3$ as boron source and whose steps for the forming of a structure of $n^+pp^+$ type on silicon wafers total a number of six which are:

Step 1: $BBr_3$ is diffused on a silicon wafer of type p, degreased on the front and back surfaces.

Step 2: The boron-doped silicon oxide layer thus formed at Step 1 is removed on the front and back surfaces, this layer hereafter being called the BSG layer (Boro-Silicate Glass).

Step 3: The back surface is protected by depositing a thermal oxide of narrow thickness surmounted by silicon nitride ($SiN_x$) (deposited by PECVD (Plasma Enhanced Chemical Vapor Deposition). This step also allows passivation of the back surface.

Step 4: The boron which has diffused on the front surface is cleaned in hot sodium hydroxide.

Step 5: Phosphorus is diffused from a liquid $POCl_3$ source on the front surface.

Step 6: The phosphorus-doped silicon oxide layer formed at Step 5 is removed, hereinafter called the PSG layer (Phospho-Silicate Glass). This step 6 is not explicitly described in this publication but it evidently must be performed to continue with the obtaining of a solar cell.

A publication titled <<Record efficiencies of solar cells based on n-type multi-crystalline silicon>> by J. LIBAL et al., 22$^{nd}$ European Photovoltaic Solar Energy Conference, Milan, Italy, 2007, describes another process for fabricating silicon wafers also using $BBr_3$ as boron source. The fabrication process comprises the four following steps for the formation of a structure of $p^+nn^+$ type on silicon wafers:

Step 1: $BBr_3$ is diffused as boron source using the <<back to back>> technique i.e. two silicon wafers are placed back to back. A boron rich layer is formed (hereinafter BRL).

Step 2: To facilitate the removal of the BRL, in situ oxidation is conducted to convert the BRL to a boron-doped silicon oxide layer (BSG). The boron-doped silicon oxide layer (BSG) and the BRL thus formed are removed by immersing in a hydrofluoric acid solution.

Step 3: The silicon wafers are flipped over so that they are <<face to face>>, $POCL_3$ is diffused and a phosphorus-doped silicon oxide layer (PSG) is formed at the same time as a B-BSF;

Step 4: the phosphorus-doped silicon oxide layer (PSG) formed at Step 3 is removed.

The process described in this 2$^{nd}$ publication, also using $BBr_3$ as boron source, allows a reduction in the number of steps needed to produce a silicon wafer having a $p^+nn^+$ type structure compared with the process in the 1$^{st}$ publication, through the use of the <<back to back>> technique. Nonetheless, this <<back to back>> technique causes diffusion on the edges of the protected side of the silicon wafer.

It is to be noted that on account of the symmetry of the process described in this 2$^{nd}$ publication, it would also be possible to obtain a $n^+pp^+$ structure as in the 1$^{st}$ publication.

Another publication titled <<Silicon solar cells with boron back surface field formed by using boric acid>>, D. Kim et al., 22$^{nd}$ European Photovoltaic Solar Energy Conference, Milan, Italy, 2007, describes another process for fabricating junctions on silicon wafers in which the steps concerning the obtaining of structures of $n^+pp^+$ type use another boron depositing technique, namely spin-coating which comprises the following steps:

Step 1: Boron is deposited by spin coating boric acid.

Step 2: The boron is diffused.

Step 3: The boron-doped silicon oxide layer (BSG) formed at Step 1 is removed.

Step 4: Phosphorus is deposited by spin coating phosphoric acid.

Step 5: The phosphorus is diffused.

Step 6: the phosphorus-doped silicon oxide layer (PSG) formed at Step 5 is removed.

This process described in this publication has the disadvantage that it cannot be performed on several silicon wafers at the same time. Depositing of the dopant by spin coating can effectively be conducted on only one silicon wafer at a time.

It is therefore ascertained from the above-described processes for fabricating photovoltaic cells, in particular the steps concerning the obtaining of a structure of $n^+pp^+$ type by forming a B-BSF, that it is necessary to carry out numerous steps which leads to high costs when manufacturing these silicon-based cells.

In addition, some of these processes such as the one described in the $3^{rd}$ publication, do not allow the diffusing of boron on several silicon wafers at once.

The above-cited state of the art points to the complexity involved in order to produce a structure of $n^+pp^+$ type using boron diffusion for the formation of a B-BSF, as part of a process for manufacturing silicon photovoltaic cells.

BRIEF SUMMARY

The present invention sets out to overcome these shortcomings by providing a fully original method for preparing a structure of $n^+pp^+$ type or $p^+nn^+$ type on silicon wafers in relation to the type of substrate, whose $p^+$ region is obtained by diffusing boron so as to obtain a B-BSF, and which comprises a reduced number of steps compared with those known in the state of the art. This method is limited to three main steps.

Additionally, the method of the invention has the advantage of having recourse to techniques conventionally used in the field of photovoltaic cells, and which are simple to implement such as PECVD.

The method for preparing a structure of $n^+pp^+$ type or $p^+nn^+$ type on a silicon wafer according to the present invention is characterized in that it comprises the following successive steps:

a) On a silicon wafer of type p or type n which comprises a front surface and a back surface, a boron-doped silicon oxide layer (BSG) is formed by PECVD on the back surface, then a barrier layer against $SiO_x$ diffusion.

b) A phosphorus source is diffused so that the phosphorus and boron co-diffuse, and also so as to form:
on the front surface of the wafer obtained after step a):
a layer of phosphorus-doped silicon oxide (PSG);
a $n^+$ doped region,
and on the back surface of the wafer obtained after step a):
a boron rich layer (BRL), and
a $p^+$ doped region.

c) the BSG, PSG and SiOx oxide layers are removed, the BRL is oxidized and the layer resulting from this oxidation is removed.

The silicon wafer may be cut from an ingot of monocrystalline silicon formed using the Czochralski drawing process (CZ silicon wafer) or using the floating zone drawing process (FZ silicon wafer), or from an ingot of multicrystalline silicon (multicrystalline silicon wafer), or from a silicon ribbon, for example an EFG wafer cut from a silicon ribbon using the Edge-defined Film-fed Growth technique, or a RGS wafer cut from a ribbon of silicon obtained using the Ribbon Growth on Substrate technique.

The thickness of the silicon wafer is advantageously between 50 μm and 500 μm.

At step a) of the method of the invention, the depositing of the BSG layer and of the SiOx layer are conducted successively in one same reactor.

Therefore, at step a) of the preparation method according to the invention, PECVD depositing of the BSG layer can be conducted at a temperature of between 300 and 400° C. The power of the plasma may be between 500 and 1500 W. As precursors the following are used: silane, trimethyl-borate (known as TMB and having the chemical formula $B(OCH_3)_3$) as boron source, and nitrous oxide ($N_2O$).

Advantageously, the flow rate of silane is between 30 and 60 sccm (standard cubic centimeters per minute i.e. $cm^3$/minute under the following standard conditions of temperature and pressure: T=0° C. and P=101325 kPa). The flow rate of TMB may be between 100 and 1000 sccm. The flow rate of $N_2O$ may be between 500 and 2000 sccm.

Advantageously, the depositing time is between 10 and 20 minutes.

With regard to the depositing of $SiO_x$ by PECVD, the temperature is preferably between 300 and 400° C. The power may be between 500 and 1500 W. As precursors, silane is used at a flow rate advantageously of between 20 and 50 sccm, and $N_2O$ at a preferable flow rate of between 400 and 1000 sccm.

On completion of step a) of the method of the invention, a silicon wafer is therefore obtained which comprises:
a silicon wafer of type p or n,
a BSG layer,
a barrier layer against $SiO_x$ diffusion.

Advantageously, step b) of the method of the invention is conducted in a low pressure, thermal diffusion furnace. This may be a quartz diffusion furnace. Preferably, a diffusion furnace of LYDOP® type is used (i.e. a furnace operating at low pressure whose technical characteristics are described in international patent application WO 02/093621 A), which allows diffusion of the dopants in the silicon wafer.

In another embodiment of the invention, step b) may be conducted in a furnace under atmospheric pressure.

Therefore at this step b) of the method, the $n^+$ and $p^+$ regions of the silicon wafer are formed.

Advantageously, step b) of the method of the invention comprises the following successive steps:

b1) First, boron is diffused in the silicon wafer from the BSG layer formed after step a), then b2) A source of phosphorus is diffused so that the boron and phosphorus co-diffuse.

More specifically, in this embodiment of step b), first the boron is diffused in the silicon wafer from the BSG layer which was formed at step a), which allows the formation of the $p^+$ region. For this purpose, the temperature of the furnace may be between 850 and 1050° C. Advantageously the flow rate of the oxygen gas is between 500 and 2000 sccm. Diffusion of the boron can be carried out for 15 minutes to 90 minutes depending on temperature. The pressure is advantageously held at between 200 and 400 mbars. Boron diffusion is initiated before the diffusion of the phosphorus since it requires a longer time to form a sufficient BSF.

$POCl_3$ is then added to the furnace, and the diffusion of phosphorus is initiated which allows the formation of the $n^+$ region. The boron continues to diffuse, which allows the continued formation of the $p^+$ region. The boron and phosphorus therefore co-diffuse. For this purpose, the flow rate of the oxygen gas is advantageously reduced to between 300 and 1000 sccm. The flow rate of $POCl_3$ can be set at between 300 and 800 sccm. Preferably, this co-diffusion occurs during a time of between 10 and 60 minutes.

Therefore, after step b) of the method of the invention, a silicon wafer is obtained which comprises:
- a PSG layer;
- a type n$^+$ region;
- a silicon wafer of type p or n;
- a type p$^+$ region,
- a BRL;
- a BSG layer;
- a barrier layer against SiO$_x$ diffusion.

Step c) of the preparation method according to the invention may comprise the following successive steps:
- c1) 1$^{st}$ wet chemical etching is performed, for example in a solution of hydrofluoric acid of concentration between 1 and 10% (namely diluted to between 1 and 10% in deionized water) so as to remove the BSG and PSG layers;
- c2) The BRL is oxidized, for example by passing gaseous oxygen at a flow rate of between 500 and 2000 sccm, at a temperature of between 700 and 1000° C., so as to obtain a thin layer of BSG formed from the boron present in the BRL and the oxygen present in the furnace atmosphere;
- c3) A 2$^{nd}$ wet chemical etching is performed, for example in a 2% hydrofluoric acid solution, so as to remove the BSG oxide layer formed on completion of step c2).

It is to be noted that the thermal oxidation used at step c2) can be replaced by wet oxidation using a boiling nitric acid solution or a mixture of sulphuric acid and potassium permanganate at step c). However, this technique is less advantageous on account of environmental problems which may arise through the use of these chemical compounds.

Step c) of the method of the invention is advantageously implemented in an oxidation furnace, even in the thermal diffusion furnace used at step b) (e.g. a furnace of LYDOP® type).

On completion of step c) of the method of the present invention, a silicon wafer is obtained which comprises:
- a region of type n$^+$,
- a silicon wafer of type p or n;
- a region of type p$^+$.

Preferably, the method of the invention to prepare a structure of type n$^+$pp$^+$ or type p$^+$nn$^+$ on silicon wafers according to the present invention is characterized in that it comprises the successive steps a) to c) such as described above.

A further subject of the present invention is a silicon wafer having a structure of type n$^+$pp$^+$ or type p$^+$nn$^+$ able to be obtained with the preparation method such as described above.

One subject of the invention is a process for manufacturing a photovoltaic cell during which a silicon wafer is prepared having a structure of type n$^+$pp$^+$ or type p$^+$nn$^+$ using the preparation method such as described above.

A further subject of the invention is a process for manufacturing photovoltaic cells characterized in that it comprises the following steps:
- a) A silicon wafer is prepared having a structure of type n$^+$pp$^+$ or type p$^+$nn$^+$ following the preparation method such as described above.
- b) An anti-reflectance layer is deposited on the front surface of the silicon wafer obtained on completion of step a).
- c) Optionally, a passivation layer is deposited on the back surface.
- d) Electric contacts in the form of grids are positioned on the front and back surfaces of the silicon wafer obtained after step b), or optionally after step c).

Step b) is advantageously conducted via PECVD by depositing Si$_x$N$_y$:H (i.e. hydrogenated silicon nitride).

Optionally, step b) could be performed using UV-CVD (ultraviolet chemical vapor deposit).

The placing of electric contacts at step d) is conducted by serigraphy, followed by annealing to harden the metal paste deposited during the said serigraphy and to ensure good contact. The serigraphy of the contacts in grids (particularly on the back surface) allows the bending of the silicon wafers to be avoided, as is the case with photovoltaic cells comprising an Al-BSF.

A further subject of the present invention is a photovoltaic cell able to be obtained with the manufacturing process described above.

BRIEF DESCRIPTION OF THE DRAWINGS

The invention will be better understood with the help of the detailed description set forth below in connection with the appended drawing which, as a non-limiting example, particularly illustrates one embodiment of the method for preparing a structure of type n$^+$pp$^+$ on silicon wafers according to the invention.

DETAILED DESCRIPTION

Figure 1:
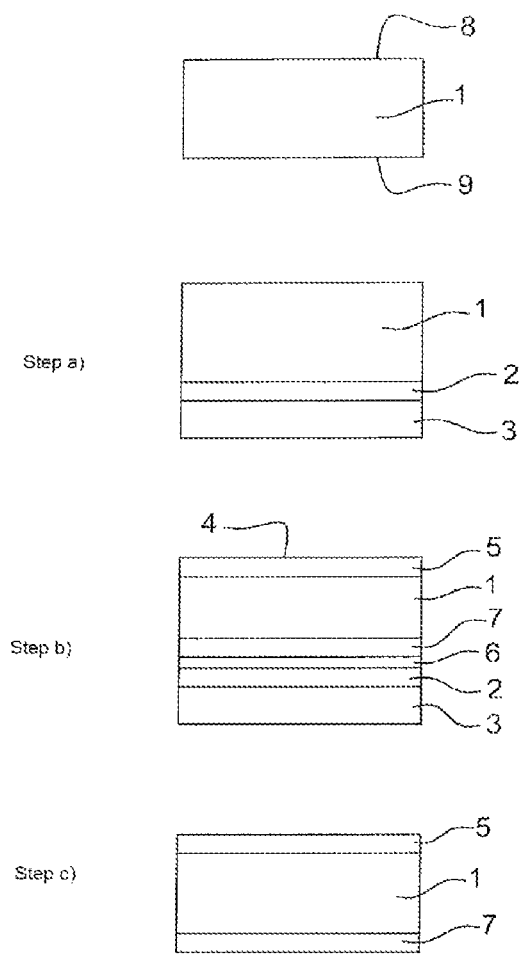
FIG. 1 schematically illustrates the conducting of steps a) to c) of the preparation method according to the invention.

FIG. 1 schematically illustrates the conducting of steps a) to c) of the method for preparing a silicon wafer having a structure of type n$^+$pp$^+$ according to the invention, namely the silicon wafer obtained after each of these steps.

A silicon wafer 1 is used of type p which comprises a front surface 8 and a back surface 9.

At step a) of the preparation method according to the invention, PECVD is used to form a boron-doped silicon oxide layer (BSG) 2 on the back surface 9 of this type p silicon wafer 1, then a barrier layer against SiO$_x$ diffusion 3 is formed. After step a) such as illustrated in FIG. 1 a silicon wafer is obtained which comprises:
- a type p silicon wafer 1,
- a BSG layer 2,
- a barrier layer 3 against SiO$_x$ diffusion.

Then at step b) of this method, first boron is diffused. Next, a source of phosphorus is diffused so that the phosphorus and boron co-diffuse and form a phosphorus-doped silicon oxide layer (PSG) 4 and a n$^+$ type region 5 namely a phosphorus rich region (or in other words highly doped with phosphorus) on the front surface 8 of the silicon wafer obtained after step a), and on the back surface 9 a p$^+$ doped region 7 and a boron rich layer (BRL) 6.

In this manner, after step b) such as illustrated in FIG. 1, a silicon wafer is obtained which comprises:
- a PSG layer 4,
- a type n$^+$ region 5,
- a type p silicon wafer 1,
- a type p$^+$ region 7
- a BRL 6,
- a BSG layer 2
- a barrier layer 3 against SiO$_x$ diffusion.

At step c) of the said method of the invention, the BSG 2, PSG 4 and SiO$_x$ 3 layers are removed, the BRL 6 is oxidized and the layer resulting from this oxidation is removed. As illustrated in FIG. 1, a silicon wafer after step c) is obtained which comprises:
- a type n$^+$ region 5
- a type p silicon wafer 1, and
- a type p$^+$ region 7 which forms the B-BSF of the said silicon wafer.

Figure 2:
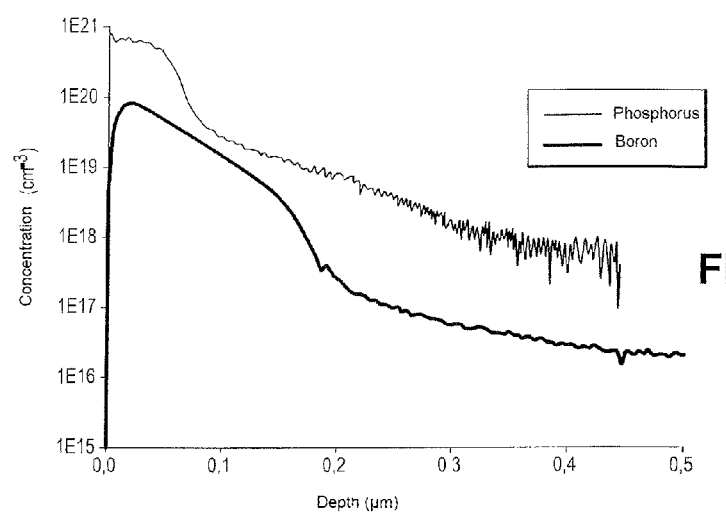
FIG. 2 is a graph illustrating the diffusion profile of the dopants (namely phosphorus and boron) at 850° C. for 60 minutes as a function of depth in the silicon wafer.

FIG. 2 is a graph illustrating the diffusion profile at 850° C. for 60 minutes of the dopants (phosphorus and boron) of a silicon wafer such as prepared according to the method of the invention. Therefore the concentration (expressed as the number of atoms of phosphorus and boron respectively per cm$^3$) is expressed as a function of their depth (expressed in μm) in the silicon wafer. Measurements were performed by SIMS (Secondary Ion Mass Spectroscopy).

Figure 3:
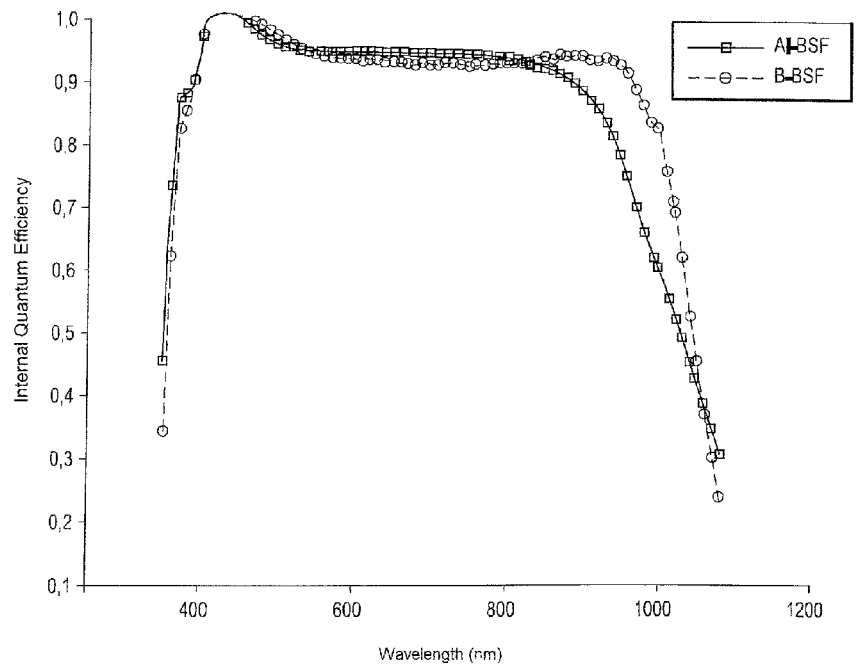
FIG. 3 is a graph showing the internal quantum yield obtained on two photovoltaic cells of which one was manufactured following the method of the invention and the second with an Al-BSF.

FIG. 3 and Table 1 show the feasibility results of the method of the invention compared with the method known in the state of the art with an Al-BSF.

FIG. 3 is a graph showing the internal quantum yield obtained on two photovoltaic cells formed from substrates of type p monocrystalline silicon, of which one had an Al-BSF and the other cell was prepared according to the invention i.e. with a B-BSF. The cell having an Al-BSF was manufactured following the conventional method for preparing this type of cell.

Table 1 below details the photovoltaic magnitudes obtained for these two cells.

TABLE 1

Photovoltaic magnitudes obtained on the two photovoltaic cells

|  | Jcc (mA/cm$^2$) | Vco (mV) | FF (%) | Yield (%) |
|---|---|---|---|---|
| Cell with an Al-BSF | 33.8 | 612 | 71.8 | 14.8 |
| Cell of the invention with a B-BSF | 34.8 | 615 | 72.5 | 15.5 |

In Table 1 above, the abbreviation <<Jcc>> indicates the short-circuit photocurrent density and the abbreviation <<Vco>> is the open-circuit voltage. The abbreviation <<FF>> stands for the form factor and <<Yield (%)>> indicates the yield of photovoltaic conversion.

The invention claimed is:

1. A method for preparing a structure of type n$^+$pp$^+$ or type p$^+$nn$^+$ on a silicon wafer, comprising the following successive steps:
   a) on a silicon wafer of type p or type n which comprises a front surface and a back surface, PECVD is conducted to form on a back surface a layer of boron-doped silicon oxide (BSG), then depositing a SiOx diffusion barrier layer on the boron-doped silicon oxide (BSG);
   b) a phosphorus source is diffused so that the phosphorus and boron co-diffuse and so as also to form:
      on the front surface of the wafer obtained after step a):
         a phosphorus-doped silicon oxide layer (PSG),
         a n$^+$ doped region
      and on the back surface of the wafer obtained after step a):
         a boron rich layer (BRL), and
         a p$^+$ doped region;
   c) the BSG, PSG and SiOx layers are removed, the BRL is oxidized and the oxidized BRL layer is removed.

2. The preparation method according to claim 1 wherein during the formation of the BSG layer, the precursor used as boron source is trimethyl-borate.

3. The preparation method according to claim 1, wherein the formation of the BSG layer is conducted at a temperature of between 300 and 400° C. and at a power of between 500 and 1500 W.

4. The preparation method according to claim 1 wherein the depositing of SiOx by PECVD is performed at a temperature of between 300 and 400° C. and at a power of between 500 and 1500 W.

5. The preparation method according to claim 1, wherein step b) is conducted in a thermal diffusion furnace at low pressure or at atmospheric pressure.

6. The preparation method according to claim 1, wherein step b) comprises the following successive steps:
   b1) first boron is diffused in the silicon wafer from the BSG layer formed on completion of step a), then
   b2) a phosphorus source is diffused so that the boron and the phosphorus co-diffuse.

7. The preparation method according to claim 1, wherein step c) comprises the following successive steps:
   c1) a 1$^{st}$ chemical etching is performed so as to remove the BSG and PSG layers;
   c2) the BRL is oxidized;
   c3) a 2$^{nd}$ chemical etching is performed so as to remove the oxide layer formed on completion of step c2).

8. A process for manufacturing photovoltaic cells wherein it comprises the following steps:
   a) a silicon wafer is prepared having a structure of type n$^+$pp$^+$ or type p$^+$nn$^+$ following the preparation method according to claim 1;
   b) an anti-reflectance layer is deposited on the front surface of the silicon wafer obtained on completion of step a);
   c) optionally, a passivation layer is deposited on the back surface;
   d) electric contacts are arranged in the form of grids on the front and back surfaces of the silicon wafer obtained after step b) or optionally after step c).

* * * * *